(12) United States Patent
Bernstein et al.

(10) Patent No.: US 8,298,906 B2
(45) Date of Patent: Oct. 30, 2012

(54) TRENCH DECOUPLING CAPACITOR FORMED BY RIE LAG OF THROUGH SILICON VIA (TSV) ETCH

(75) Inventors: Kerry Bernstein, Underhill, VT (US); Francis Roger White, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 12/511,545

(22) Filed: Jul. 29, 2009

(65) Prior Publication Data

US 2011/0027962 A1 Feb. 3, 2011

(51) Int. Cl.
*H01L 21/20* (2006.01)

(52) U.S. Cl. ........ 438/386; 438/706; 257/E21.008; 257/502

(58) Field of Classification Search .......... 438/386, 438/243, 387, 391, 700–706; 257/301, E21.647, 257/E27.092, E21.008
See application file for complete search history.

(56) References Cited

U.S. PATENT DOCUMENTS

| | | | |
|---|---|---|---|
| 6,221,769 B1 * | 4/2001 | Dhong et al. | 438/667 |
| 6,284,666 B1 | 9/2001 | Naeem et al. | |
| 6,900,136 B2 | 5/2005 | Chung et al. | |
| 6,962,872 B2 * | 11/2005 | Chudzik et al. | 438/626 |
| 6,967,136 B2 * | 11/2005 | Akatsu et al. | 438/243 |
| 7,030,481 B2 | 4/2006 | Chudzik et al. | |
| 2006/0124982 A1 | 6/2006 | Ho et al. | |
| 2008/0079121 A1 | 4/2008 | Han | |
| 2009/0008794 A1 * | 1/2009 | Wu et al. | 257/777 |
| 2009/0039467 A1 | 2/2009 | Chinthakindi et al. | |
| 2010/0041203 A1 * | 2/2010 | Collins et al. | 438/386 |
| 2010/0044853 A1 * | 2/2010 | Dekker et al. | 257/692 |

OTHER PUBLICATIONS

Jansen et al., "RIE Lag in High Aspect Ratio Trench Etching of Silicon," Microelectronic Engineering vol. 35, Issue 1, 1997, pp. 45-50.

Chou et al., "Fabrication of out-of-plane curved surfaces in SI by utilizing RIE Lag", IEEE 2002. pp. 145-148.

* cited by examiner

*Primary Examiner* — Julio J Maldonado
*Assistant Examiner* — Sonya McCall Shepard
(74) *Attorney, Agent, or Firm* — David Cain; Roberts Mlotkowski Safran & Cole, P.C.

(57) ABSTRACT

A trench decoupling capacitor is formed using RIE lag of a through silicon via (TSV) etch. A method includes etching a via trench and a capacitor trench in a wafer in a single RIE process. The via trench has a first depth and the capacitor trench has a second depth less than the first depth due to RIE lag.

24 Claims, 5 Drawing Sheets

TRENCH DECOUPLING CAPACITOR FORMED BY RIE LAG OF THROUGH SILICON VIA (TSV) ETCH

FIELD OF THE INVENTION

The invention generally relates to the fabrication of semiconductor circuit chips and, more particularly, to a deep trench decoupling capacitor for a semiconductor circuit and a process for manufacturing the deep trench decoupling capacitor.

BACKGROUND

On-chip decoupling capacitors (commonly referred to as "decaps") are typically used to prevent noise-related circuit degradation. More specifically, in advanced electronic computing systems, the decoupling capacitors serve as a charge reservoir to support instantaneous current surges that accompany simultaneous circuit switching. Decoupling capacitors may be employed on chip and across all levels of packaging, including single chip and multi chip modules, board and back plane. In addition, these passive components may be utilized in the power distribution systems for integrated circuits (IC) to reduce the simultaneous circuit switching noise.

Conventional decoupling capacitors are formed either as planar capacitors or trench type capacitors. In trench type capacitors, a trench is made directly in the silicon wafer and the sidewalls of the trench are used for the capacitor dielectric. For example, a deep hole is etched out of a Si-containing substrate wafer by a commonly used dry etch method known as reactive ion etching (RIE). A dielectric material usually with a high dielectric constant is deposited in a form of a conformal layer inside the hole. The inner surface on one side of the trench, and a conductive or a semiconductor material fill on the other side of the dielectric material serve as capacitor plates. The film thickness of the dielectric material is inversely proportional to the charge the film can hold. Thus, the thickness of the film is typically kept to a minimum to the extent allowed by the process capability. The surface area of the dielectric film is directly proportional to the charge holding capacity, also known as capacitance.

In this manner, the planar area of trench capacitors (e.g., the "footprint" on the top surface of the wafer) can be made fairly small. Moreover, as the trenches are processed prior to the polygate conductor module, there is no issue of trench capacitors causing across chip linewidth variation (ACLV) problems. However, a significant detractor of using a trench capacitor approach as a decoupling capacitors is the process complexity and cost. Moreover, the depth of deep trench capacitors is often limited by RIE lag.

RIE lag is a phenomenon that limits etching depth as a function of the critical dimension (e.g., width or diameter when viewed in plan view) of the printed image on the surface of a wafer being etched. RIE lag is an artifact of the long diffusion path from the surface of the wafer to bottom of the trench. The long diffusion path limits the availability of reactive etch species at the etch front (e.g., leading edge), and also limits the ability to evacuate the reaction by-products. RIE lag is particularly prevalent when etching high aspect ratio trench holes, where aspect ratio is defined as the ratio of the depth of the etched structure relative to its width or its diameter in plan view (e.g., the critical dimension).

Trench-type decoupling capacitors may be used in chips being prepared for three-dimensional integration (e.g., stack packages, etc.). Such chips typically include at least one through silicon via (TSV) that provides an electrical connection between chips that are vertically stacked, one atop another. However, fabricating a deep trench capacitor and a TSV in a chip can be prohibitively expensive in terms of process complexity and cost.

Accordingly, there exists a need in the art to overcome the deficiencies and limitations described hereinabove.

SUMMARY

In a first aspect of the invention, there is a method of forming a semiconductor structure, the method including etching a via trench and a capacitor trench in a wafer in a single RIE process. The via trench has a first depth and the capacitor trench has a second depth less than the first depth due to RIE lag.

In another aspect of the invention, there is a method for forming a semiconductor structure. The method includes: forming a hard mask on an upper surface of a substrate; forming a first opening in the hard mask, the first opening having a first dimension; and forming a second opening in the hard mask, the second opening having a second dimension smaller than the first dimension, the method also includes substantially simultaneously etching a first trench of a first depth and a second trench of a second depth in the substrate through the first opening and the second opening, respectively. RIE lag limits the second depth of the second trench to less than the first depth of the first trench.

In another aspect of the invention, there is a method for fabricating a through silicon via and a trench capacitor in a wafer, including etching a via trench and a capacitor trench in the wafer at a same time using a same RIE process. A first dimension of the via trench is of a first size such that a depth of the via trench is substantially unaffected by RIE lag during the etching, while a second dimension of the capacitor trench is of a second size such that a depth of the capacitor trench is limited by RIE lag during the etching.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to the fabrication of semiconductor circuit chips and, more particularly, to a deep trench decoupling capacitor for a semiconductor circuit and a cost effective process for manufacturing the deep trench decoupling capacitor. In accordance with aspects of the invention, at least one trench for a trench-type decoupling capacitor is etched substantially simultaneously with at least one trench for a TSV using a single reactive ion etching (RIE) process. In embodiments, RIE lag is used to selectively control a depth of the capacitor trench relative to a depth of the TSV trench. In this manner, a capacitor trench and a TSV trench can be formed using the same etch, thereby reducing process complexity and overall manufacturing cost.

RIE lag is typically considered to be an impediment in semiconductor fabrication, due to its effect of limiting the depth that can be achieved for a trench given a particular critical dimension. However, implementations of the invention advantageously utilize RIE lag to reduce the number of processing steps required to form respective trenches for at least one TSV and at least one trench capacitor in a chip. In embodiments, by selectively controlling the dimensions of different openings in a hard mask, RIE lag is employed to form trenches of varying depth in a single etch.

Figure 1:
FIGS. 1-8 show side views of structures and respective processing steps in accordance with aspects of the invention.

FIGS. 1-8 show side views of structures and respective processing steps in accordance with aspects of the invention. More specifically, FIG. 1 depicts an Si-containing semiconductor wafer 10 (e.g., substrate) in which at least one TSV and at least one trench capacitor are to be formed in accordance with aspects of the invention. Illustrative examples of Si-containing materials that can be employed as the wafer 10 include, but are not limited to: Si, SiGe, SiC, SiGeC, and layered semiconductors such as Si/SiGe, a silicon-on-insulator (SOI) or a SiGe-on-insulator (SGOI). For example, the wafer 10 may comprise a 200 mm wafer composed of doped Si having a thickness of about 725 μm; however, the invention is not limited to this exemplary wafer, and any suitable semiconductor wafer may be used within the scope of the invention.

Still referring to FIG. 1, in embodiments, a hard mask 15 is formed on the top surface of the wafer 10. The hard mask 15 may be composed of any suitable material including, but not limited to, a tetraethylorthosilicate (TEOS) deposited glass layer, or an oxide layer such as borosilicate glass (BSG). The hard mask 15 may be deposited using conventional processes, such as, for example, chemical vapor deposition (CVD), or any other suitable process. In embodiments, the hard mask 15 has a thickness of about 10 μm, although the invention is not limited to this thickness, and any suitable thickness may be used.

Although not depicted in FIG. 1, at least one of a pad oxide film and a pad nitride film may optionally be formed between the upper surface of the wafer 10 and the hard mask 15. The optional pad film(s) may be composed of any suitable materials, including but not limited to $SiO_2$, $Si_3N_4$, etc., and may be formed using conventional processes, such as, for example, chemical vapor deposition (CVD), atomic layer deposition (ALD), physical vapor deposition (PVD), and plasma enhanced chemical vapor deposition (PECVD). The optional pad film(s) may be formed on the upper surface of the wafer 10 prior to forming the hard mask 15.

Figure 2:
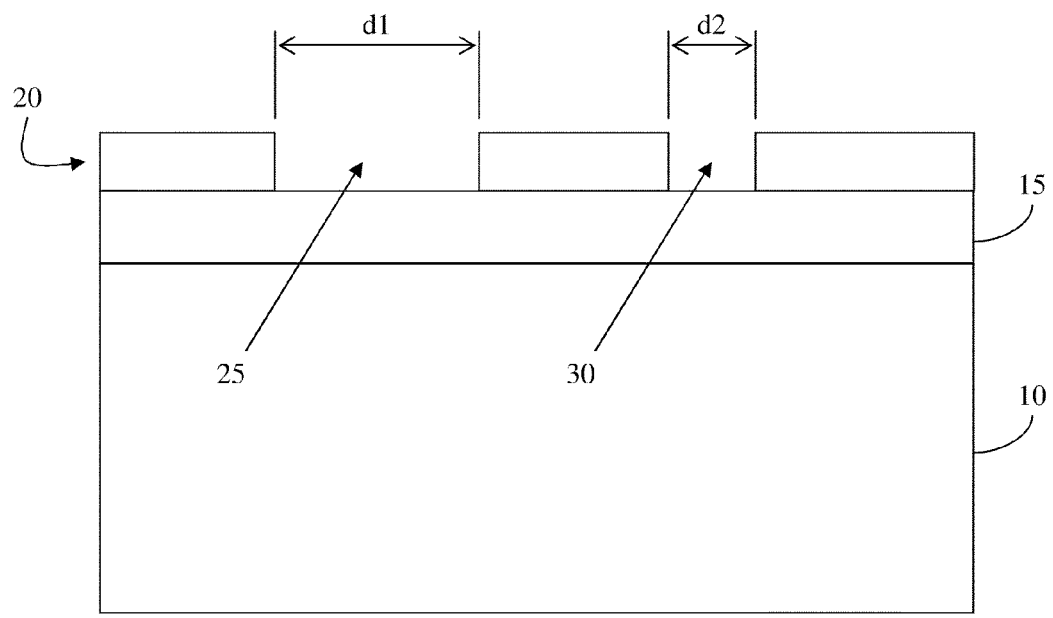

As shown in FIG. 2, a photoresist layer 20 is deposited and patterned (e.g., exposed and developed) on the hard mask 15. The photoresist layer 20 is deposited and patterned using conventional lithographic materials and etching processes. In embodiments, the pattern formed in the photoresist layer 20 includes at least one large hole 25 and at least one small hole 30. In embodiments, the large hole 25 has a first dimension d1 and the small hole 30 has a second dimension d2, the first dimension d1 being larger than the second dimension d2. The first and second dimensions d1 and d2 may correspond to a diameter and/or width of the holes 25 and 30.

Figure 3:
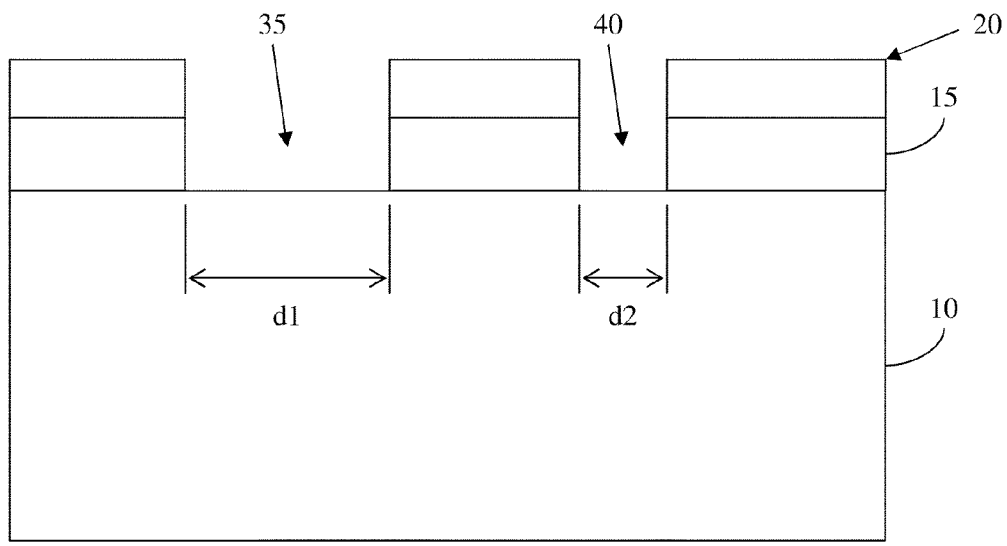
Figure 4:
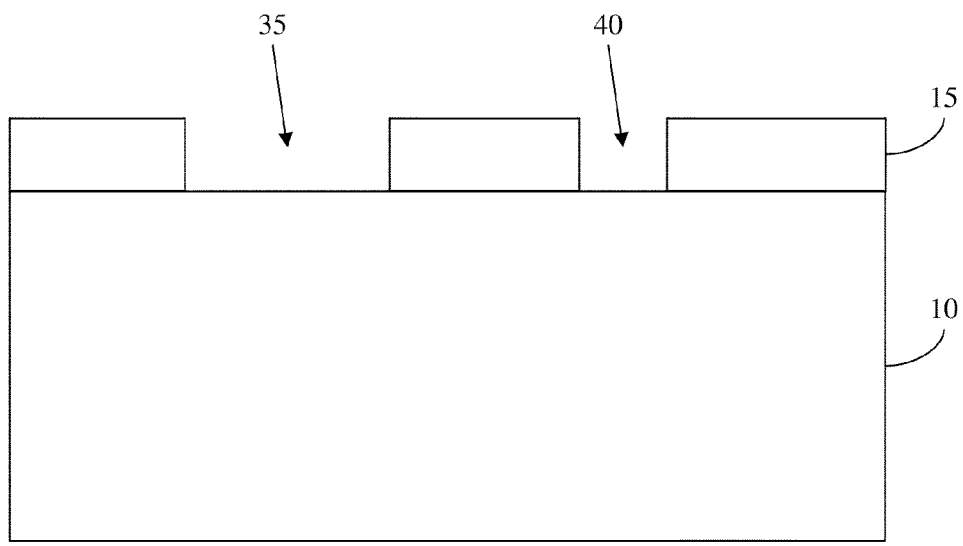

As depicted in FIG. 3, at least one large opening 35 and at least one small opening 40 are formed in the hard mask 15 with the photoresist layer 20 acting as a mask. The openings 35 and 40 in the hard mask 15 may be formed in any conventional manner including, but not limited to, reactive ion etching (RIE), plasma etching, focused ion beam (FIB) etching, or laser ablation. The at least one large opening 35 corresponds to the at least one large hole 25 and has substantially the same first dimension d1. The at least one small opening 40 corresponds to the at least one small hole 30 and has substantially the same second dimension d2. As shown in FIG. 4, the photoresist layer 20 is stripped using conventional techniques following the formation of the at least one large opening 35 and at least one small opening 40 in the hard mask 15. Optionally, the step of stripping the photoresist layer 20 may be omitted at this point and performed later in order to maximize a thickness of the etch mask during subsequent etching of the substrate.

In accordance with aspects of the invention, the first dimension d1 is selected to correspond to a critical dimension of a TSV that will be formed in the wafer 10. Moreover, the first dimension d1 is selected to avoid the effects of RIE lag. More specifically, in embodiments, the first dimension d1 is selected with knowledge of the intended depth of the TSV such that the aspect ratio of the TSV will not incur effects of RIE lag during the etching of the TSV. In embodiments, the first dimension d1 has a magnitude in the range of about 5 to 10 μm; however, the first dimension d1 is not limited to this range of magnitude. For example, the first dimension d1 may be any suitable dimension that will avoid RIE lag during etching of the TSV, and may depend on process parameters such as, for example: intended depth of the TSV, material of the wafer, dopant density of the material of the wafer, etch species, etc.

In accordance with additional aspects of the invention, the second dimension d2 is selected to correspond to a critical dimension of a trench capacitor that will be formed in the wafer 10. Moreover, the second dimension d2 is selected to provoke RIE lag during etching of the trench capacitor. More specifically, in embodiments, the second dimension d2 is selected with knowledge of the intended depth of the trench capacitor such that the aspect ratio of the trench capacitor will cause RIE lag to limit the etching of the trench capacitor to a particular depth. In embodiments, the second dimension d2 has a magnitude of less than about 2.5 μm; however, the second dimension d2 is not limited to this magnitude. For example, the second dimension d2 may be any suitable dimension that will provoke RIE lag during etching of the trench capacitor, and may depend on process parameters such as, for example: intended depth of the trench capacitor, material of the wafer, dopant density of the material of the wafer, etch species, etc.

Figure 5:
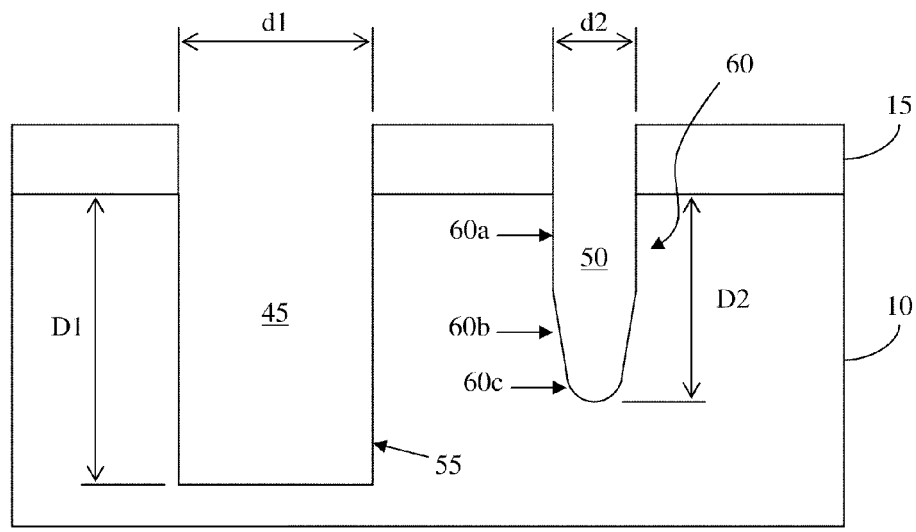

As shown in FIG. 5, and in accordance with aspects of the invention, an RIE process is used to etch at least one TSV trench 45 and at least one capacitor trench 50 in the wafer 10 through the respective openings 35, 40 in the hard mask 15. The RIE process may be a conventional RIE process having process parameters based on, for example, the material composition of the wafer 10. In embodiments, the RIE process comprises a single etch the forms the TSV trench 45 and the capacitor trench 50 substantially simultaneously.

In embodiments, the TSV trench 45 has a first depth D1 and the capacitor trench 50 has a second depth D2. The first depth D1 has a greater magnitude than the second depth D2 (e.g., is deeper when measured from the top surface of the wafer 10) because the first dimension d1 is selected to avoid RIE lag while the second dimension d2 is selected to provoke RIE lag. More specifically, due to the relatively smaller second dimension d2, RIE lag will effectively stop the etching of the capacitor trench 50 at a particular depth while the etching of the TSV trench 45 continues to a greater depth in the wafer 10 during the same etch process. In this manner, a same etching process may be used to substantially simultaneously form the TSV trench 45 and the capacitor trench 50, with the TSV trench 45 being deeper than the capacitor trench 50.

In accordance with aspects of the invention, the wafer 10 comprises a 200 mm diameter wafer that is about 725 μm thick, the TSV trench 45 has a first depth D1 of about 80 μm to about 125 µm, and the capacitor trench 50 has a second depth D2 of about 10 µm. However, the invention is not limited to these values. Rather, the respective trenches 45 and 50 in accordance with the invention may be formed in any suitable wafer to any desired depth.

Still referring to FIG. 5, in embodiments, the TSV trench 45 has substantially vertical sidewalls 55 since RIE lag does not appreciably affect the etching of the TSV trench 45, due to the relatively large first dimension d1. On the other hand, the capacitor trench 50 has tapered sidewalls 60 and a rounded bottom, as is commonly exhibited in trenches where RIE lag limits the etching. Moreover, the sidewalls 60 of the capacitor trench 50 may comprise a substantially vertical upper portion 60a at the top of the capacitor trench 50 and a tapered lower portion 60b near the rounded bottom 65c of the capacitor trench 50.

Figure 6:
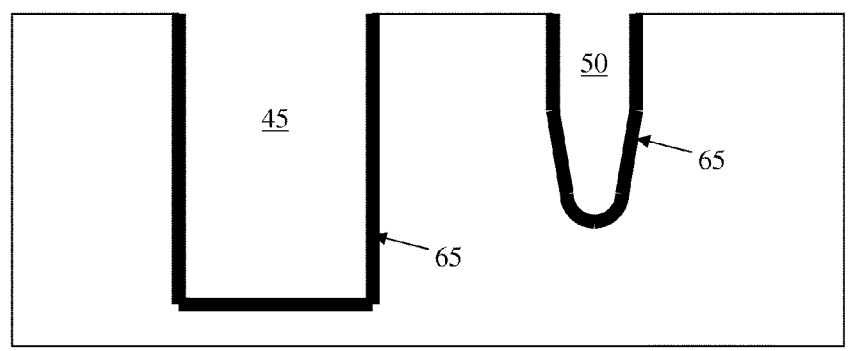

In embodiments, after the trenches 45, 50 are formed, the hard mask 15 is stripped using conventional processes. Subsequently, a liner 65 is formed on the sidewalls of the trenches 45, 50, as depicted in FIG. 6. The liner 65 may be composed of any suitable insulator, including, but not limited to: thermal oxide, oxide-nitride-oxide, etc. The liner 65 may be formed using conventional semiconductor fabrication techniques, such as, for example, CVD, ALD, PVD, PECVD. In embodiments, the liner 65 has a thickness of about 100 Angstroms to about 120 Angstroms. However, the invention is not limited to this thickness, and any suitable thickness may be employed within the scope of the invention.

In implementations of the invention, the liner 65 may be formed substantially simultaneously in the TSV trench 45 and the capacitor trench 50 by using the same deposition process for both trenches 45, 50. Alternatively, different liners composed of different materials, and further optionally of different thicknesses, may be formed in each of the respective trenches 45, 50 by using a different deposition process for each trench 45, 50.

Figure 7:
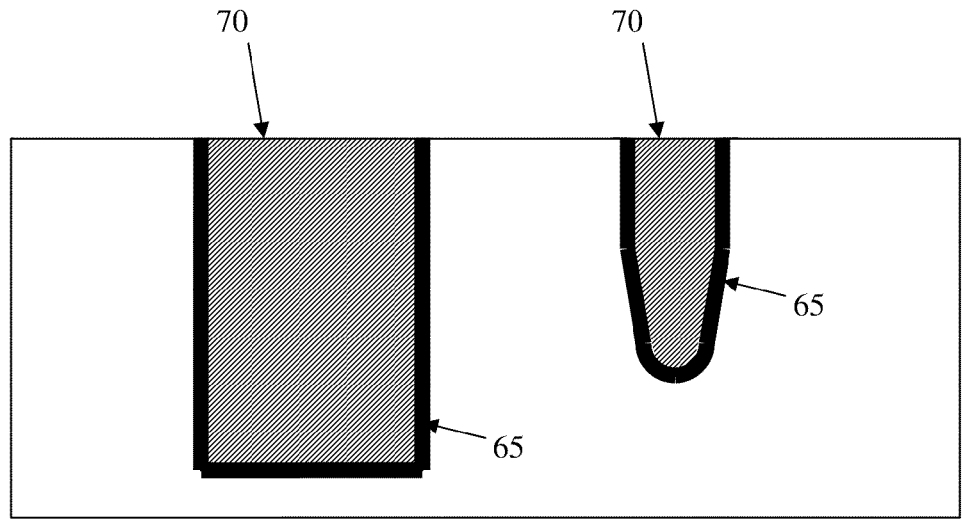

As depicted in FIG. 7, the trenches 45, 50 having the liner 65 therein are filled with a conductor 70. The conductor 70 may be composed of any suitable conductive material, such as, for example, doped polysilicon, tungsten, aluminum, copper or other metal, alloy, etc. Moreover, the conductor 70 may be formed on the liner 65 in the trenches 45, 50 using any suitable conventional semiconductor processing techniques.

In implementations of the invention, the conductor 70 may be formed substantially simultaneously in the TSV trench 45 and the capacitor trench 50 by using the same deposition process for both trenches 45, 50. Alternatively, different conductors composed of different materials may be formed in each of the respective trenches 45, 50 by using a different deposition process for each trench 45, 50.

Figure 8:
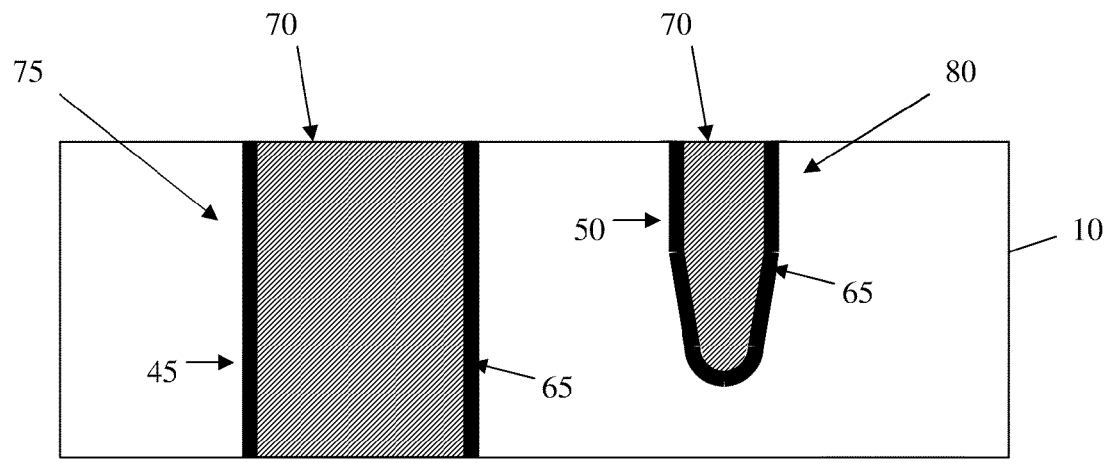

As depicted in FIG. 8, the backside of the wafer is mechanically thinned to expose the conductor 70 in the TSV trench 45, but not thinned so far as to expose the liner 65 or conductor 70 in the capacitor trench 50, resulting in a TSV 75 and a trench capacitor 80 being formed in the wafer 10. The mechanical thinning may be performed in any suitable manner, such as, for example, grinding. A chemical mechanical polish (CMP) step may be performed one or more times during the above-described processing steps to clean and planarize the top and/or bottom surface of the wafer 10, as is known such that further explanation is not believed necessary.

In accordance with aspects of the invention, a wafer 10 (e.g., substrate) comprising at least one TSV 75 and at least one trench capacitor 80 is formed in an inexpensive manner by reducing the number of processing steps. By making the critical dimension of the TSV trench sufficiently large to avoid RIE lag and the critical dimension of the capacitor trench to provoke RIE lag, the TSV trench and the capacitor trench may be formed at varying depths in the same RIE process (e.g., using a single etch). Thus, in embodiments, the different depths of the respective trenches are controlled by selecting a first dimension of the via trench such that a depth of the via trench is substantially unaffected by RIE lag during the etching, and selecting a second dimension of the capacitor trench such that a depth of the capacitor trench is limited by RIE lag during the etching. The wafer 10 may be further processed using known techniques, such as forming transistors, dicing the wafer into chips, etc.

Also, in embodiments, the liner 65 acts as an isolator in the TSV 75 and as a capacitor dielectric in the trench capacitor 80. By utilizing appropriate connections to these structures, implementations of the invention provide an alternative to conventional DRAM trench capacitor processes. In a particular embodiment, the TSV 75 is tied to VDD and the substrate is tied to ground potential, which permits the trench capacitor 80 to add capacitance across the power rail.

In accordance with aspects of the invention, it is possible to effect a personalization of a chip by selectively controlling the critical dimension of the etched trenches. In this manner, the depths of plural trenches may be controlled by appropriately selecting the critical dimensions of the respective trenches. For example, by selecting a larger critical dimension, a trench may be etched to form a connection with a structure below (e.g., a buried structure). On the other hand, it is possible to personalize a structure (e.g., a fuse and/or a chip identity), by appropriately selecting a smaller critical dimension, thereby preventing the etched trench from making contact to the structure below.

Figure 9:
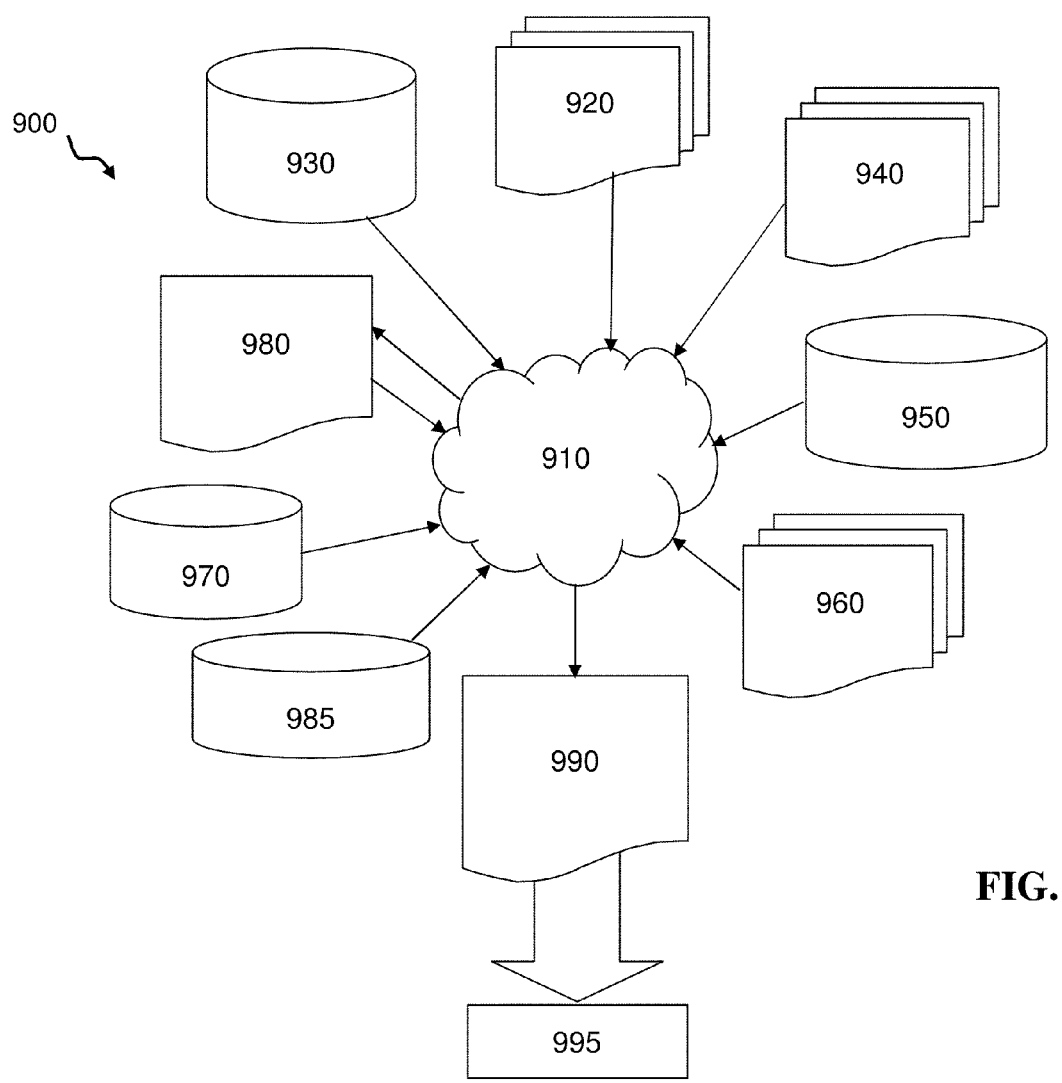
FIG. 9 is a flow diagram of a design process used in semiconductor design, manufacture, and/or test.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a semiconductor structure, comprising:
   etching a via trench and a capacitor trench in a wafer in a single RIE process, wherein:
     the via trench has a first depth which avoids effects of RIE lag, and
     the capacitor trench has a second depth less than the first depth due to the effects of RIE lag;
   forming a liner of insulator material on exposed surfaces of the via trench and the capacitor trench;
   filling the via trench and the capacitor trench with a conductor over the liner; and
   grinding a backside of the wafer and the liner in the via trench to expose at least the conductor in the via trench without exposing the liner or the conductor in the capacitor trench.

2. The method of claim 1, further comprising:
   selecting a critical dimension of the via trench to be sufficiently large to substantially avoid RIE lag during the etching, and
   selecting a critical dimension of the capacitor trench to be sufficiently small to provoke RIE lag during the etching.

3. The method of claim 2, wherein:
   the critical dimension of the via trench is about 5 µm to about 10 µm, and
   the critical dimension of the capacitor trench is less than about 2.5 µm.

4. The method of claim 1, further comprising:
   forming a first hole in a hard mask arranged on an upper surface of the wafer;
   forming a second hole in the hard mask; and
   performing the etching through the first hole and the second hole.

5. The method of claim 4, wherein:
   the first hole is of a size to substantially avoid RIE lag in the via trench during the etching, and
   the second hole is of a second size to provoke RIE lag in the capacitor trench during the etching.

6. A method for forming a semiconductor structure, comprising:
   forming a hard mask on an upper surface of a substrate;
   forming a first opening in the hard mask, the first opening having a first dimension;
   forming a second opening in the hard mask, the second opening having a second dimension smaller than the first dimension;
   substantially simultaneously etching a first trench of a first depth and a second trench of a second depth in the substrate through the first opening and the second opening, respectively,
     wherein RIE lag limits the second depth of the second trench to less than the first depth of the first trench, and forms the second trench with a vertical upper portion, a tapered lower portion, and a rounded bottom portion;
   forming materials within the first trench and the second trench; and
   grinding a backside of the substrate to expose the materials in the first trench without exposing the materials in the second trench.

7. The method of claim 6, wherein the first trench comprises a via trench and the second trench comprises capacitor trench.

8. The method of claim 6, wherein:
   the first trench has a depth of about 80 µm to about 125 µm, and
   the second trench has a depth of about 10 µm.

9. The method of claim 6, wherein:
   the first dimension is about 5 µm to about 10 µm, and
   the second dimension is less than about 2.5 µm.

10. The method of claim 6, wherein the materials include forming a liner of insulator material on exposed surfaces of the first trench and the second trench.

11. The method of claim 10, wherein the materials include filling the first trench and the second trench with a same conductive material to form a via and a capacitor in the first trench and the second trench, respectively.

12. The method of claim 11, wherein the grinding the backside of the substrate exposes the conductive material in the first trench without exposing the liner or the conductive material in the second trench.

13. A method for fabricating a through silicon via and a trench capacitor in a wafer, comprising:
   etching a via trench and a capacitor trench in the wafer at a same time using a same RIE process, wherein:
   a first dimension of the via trench is of a first size such that a depth of the via trench is substantially unaffected by RIE lag during the etching;
   a second dimension of the capacitor trench is of a second size such that a depth of the capacitor trench is limited by RIE lag during the etching;
   forming a liner of insulator material on exposed surfaces of the via trench and the capacitor trench;
   filling the via trench and the capacitor trench with a same conductive material in a same deposition process; and
   grinding a backside of the wafer to expose the liner and conductor in the via trench without exposing the liner or the conductor in the capacitor trench.

14. The method of claim 13, wherein:
   the first dimension is greater than the second dimension, and
   the depth of the via trench is greater than the depth of the capacitor trench.

15. The method of claim 13, further comprising:
   forming a hard mask on an upper surface of the wafer;
   forming a first opening in the hard mask corresponding to the first dimension; and forming a second opening in the hard mask corresponding to the second dimension.

16. The method of claim 15, further comprising:
   forming a photoresist layer on an upper surface of the hard mask;
   forming a first hole in the photoresist layer corresponding to the first dimension; and
   forming a second hole in the photoresist layer corresponding to the second dimension.

17. The method of claim 1, wherein the grinding forms a planar surface with the backside of the wafer and at least the conductor in the first trench.

18. The method of claim 17, wherein the grinding forms a planar surface with the backside of the wafer, the conductor and the liner of the first trench.

19. The method of claim 1, wherein the capacitor trench has tapered sidewalls and a rounded bottom due to the effects of RIE lag.

20. The method of claim 19, wherein the grinding a backside of the wafer and the liner in the via trench exposes the liner in the via trench.

21. The method of claim 20, wherein the filling of the via trench and the capacitor trench with the conductor comprises filling the via trench and the capacitor trench with a same conductor material in a same deposition process.

22. The method of claim of claim 1, wherein the grinding further comprises grinding the liner in the via trench to expose the liner and conductor in the via trench without exposing the liner or the conductor in the capacitor trench.

23. The method of claim 11, wherein the same conductive material is formed in the via trench and the capacitor trench in a same deposition process.

24. The method of claim 13, wherein the capacitor trench has tapered sidewalls and a rounded bottom due to the effects of RIE lag.

* * * * *